(12) United States Patent
Kawasaki et al.

(10) Patent No.: US 11,568,901 B2
(45) Date of Patent: Jan. 31, 2023

(54) SEMICONDUCTOR DEVICE

(71) Applicant: Kioxia Corporation, Tokyo (JP)

(72) Inventors: Kazushige Kawasaki, Kawasaki Kanagawa (JP); Masayuki Miura, Ota Tokyo (JP); Hideko Mukaida, Chuo Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/470,955

(22) Filed: Sep. 9, 2021

(65) Prior Publication Data
US 2022/0293138 A1   Sep. 15, 2022

(30) Foreign Application Priority Data

Mar. 9, 2021   (JP) .............................. JP2021-036816

(51) Int. Cl.
*G11C 5/06*   (2006.01)
*H01L 23/10*   (2006.01)

(52) U.S. Cl.
CPC ............... *G11C 5/06* (2013.01); *H01L 23/10* (2013.01)

(58) Field of Classification Search
CPC .................................. G11C 5/06; H01L 23/10
USPC .......................................................... 365/63
See application file for complete search history.

(56) References Cited

U.S. PATENT DOCUMENTS

| | | |
|---|---|---|
| 6,473,310 B1 | 10/2002 | Casati et al. |
| 8,355,254 B2 | 1/2013 | Ota |
| 2018/0182715 A1 | 6/2018 | Kim et al. |
| 2020/0388509 A1 | 12/2020 | Nomura et al. |
| 2021/0084775 A1 | 3/2021 | Nomura et al. |
| 2021/0257336 A1* | 8/2021 | Maeda ................ H01L 21/6836 |

FOREIGN PATENT DOCUMENTS

| | | |
|---|---|---|
| JP | 2008288250 A | 11/2008 |
| JP | 5110049 B2 | 12/2012 |
| TW | 201826459 A | 7/2018 |
| TW | 201929628 A | 7/2019 |

* cited by examiner

*Primary Examiner* — Huan Hoang
(74) *Attorney, Agent, or Firm* — Holtz, Holtz & Volek PC

(57) ABSTRACT

A semiconductor device of an embodiment includes: a wiring board having a first surface and a second surface on a side opposite to the first surface; a first semiconductor element on the first surface of the wiring board; a second semiconductor element on the first surface of the wiring board; and a first sealing material that seals at least the second semiconductor element. A slit is formed in the first sealing material between the first semiconductor element and the second semiconductor element. When a thickness of the first sealing material on the first semiconductor element is t1 and a thickness of the first sealing material on the second semiconductor element is t2, the t1 and the t2 satisfy a relationship of $0 \leq t1 < t2$.

15 Claims, 7 Drawing Sheets

SEMICONDUCTOR DEVICE

CROSS-REFERENCE TO RELATED APPLICATION

This application is based upon and claims the benefit of priority from Japanese Patent Application No. 2021-036816, filed on Mar. 9, 2021, the entire contents of which are incorporated herein by reference.

FIELD

Embodiments described herein relate generally to a semiconductor device.

BACKGROUND

In a semiconductor device including a semiconductor chip, a temperature of the semiconductor chip may become high due to heat generation. When the temperature increases, the semiconductor chip may be protected by decreasing an operation speed of the semiconductor chip.

DETAILED DESCRIPTION

Figure 1:
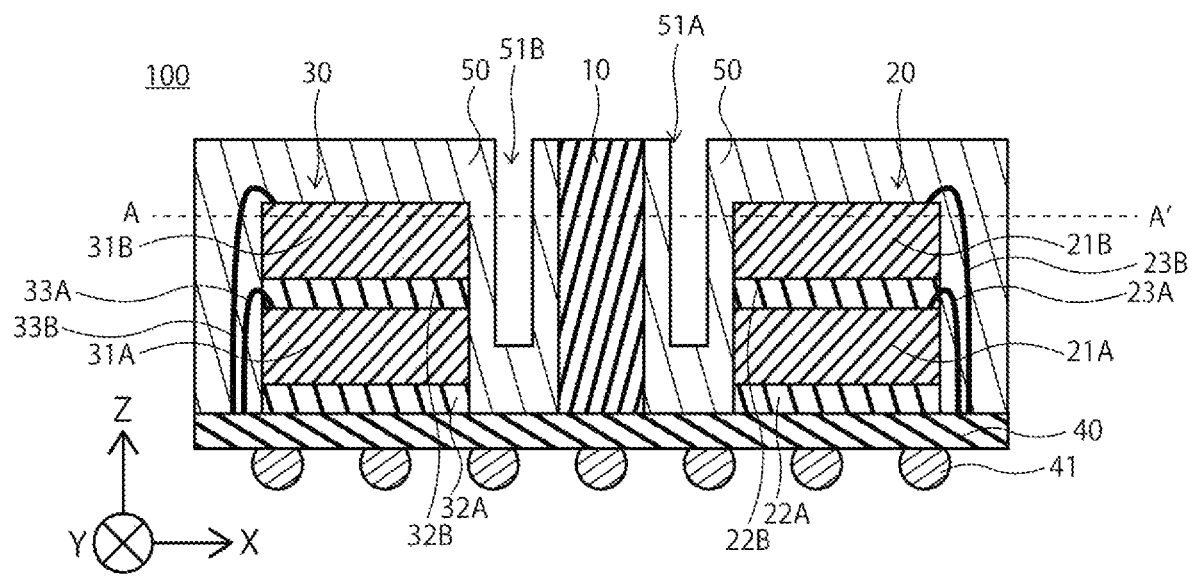
FIG. 1 is a schematic cross-sectional conceptual diagram of a semiconductor device according to a first embodiment.

A semiconductor device of an embodiment includes: a wiring board having a first surface and a second surface on a side opposite to the first surface; a first semiconductor element on the first surface of the wiring board; a second semiconductor element on the first surface of the wiring board; and a first sealing material that seals at least the second semiconductor element. A slit is formed in the first sealing material between the first semiconductor element and the second semiconductor element. When a thickness of the first sealing material on the first semiconductor element is t1 and a thickness of the first sealing material on the second semiconductor element is t2, the t1 and the t2 satisfy a relationship of $0 \leq t1 < t2$.

Hereinafter, a plurality of embodiments will be described with reference to the drawings.

Some elements are herein given a plurality of exemplary expressions. Note that these expressions are merely examples and do not hinder the elements from being expressed in other wars. Also note that elements not given a plurality of expressions may be expressed by other expressions.

The drawings are made schematically, and the relationship between a thickness and a plan view dimension, the ratio among layer thicknesses, and so on may be different from actual ones. The drawings may include portions in which the dimensional relationships and ratios are different from one another. Some reference symbols may be omitted in the drawings.

First Embodiment

Figure 2:
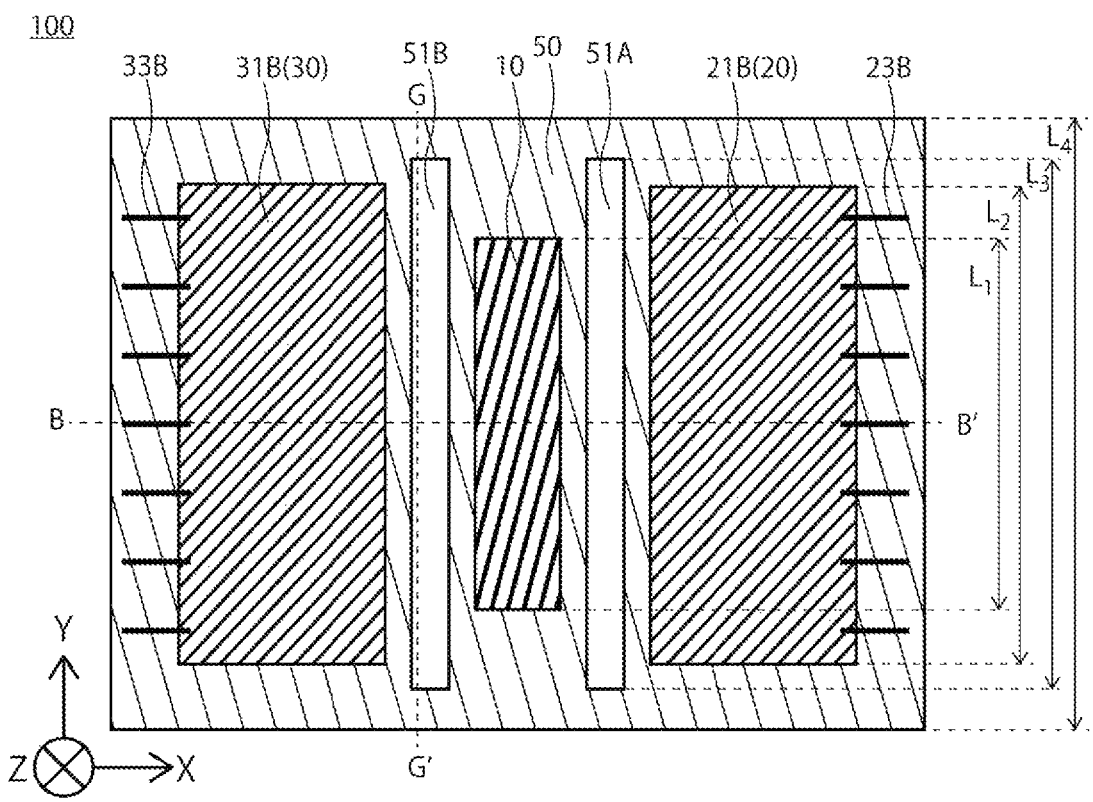
FIG. 2 is a schematic cross-sectional conceptual diagram of the semiconductor device according to a first embodiment.

FIGS. 1 and 2 are cross-sectional conceptual diagrams of a semiconductor device 100. FIG. 1 is a schematic cross-sectional conceptual diagram of the semiconductor device 100 taken along a line B-B' in FIG. 2. FIG. 2 is a schematic cross-sectional conceptual diagram of the semiconductor device 100 taken along a line A-A' in FIG. 1. More specifically, the semiconductor device 100 is a semiconductor device on which a semiconductor element such as a NAND flash memory chip is mounted. The semiconductor element mounted on the semiconductor device may be any element such as a memory chip such as a NAND flash memory or a DRAM, or a controller chip such as a CPU. It is preferable that the semiconductor device 100 is a semiconductor storage device having a semiconductor memory chip.

The semiconductor device 100 in FIG. 1 is an example of a storage device. The semiconductor device 100 includes a wiring board 40, a first semiconductor element 10, a second semiconductor element 20, a third semiconductor element 30, and a first sealing material 50. In FIG. 1 and the like, although the semiconductor device includes the third semiconductor element 30 and the first semiconductor element 10 is sandwiched between the second semiconductor element 20 and the third semiconductor element 30, a configuration in which the third semiconductor element 30 is omitted can also be adopted.

The wiring board 40 is a support board for the first semiconductor element 10, the second semiconductor element 20, and the third semiconductor element 30. More specifically, the wiring board 40 is a multilayer wiring board. The wiring board 40 has a first surface and a second surface on a side opposite to the first surface. The first semiconductor element 10, the second semiconductor element 20, and the third semiconductor element 30 are provided on the first surface side of the wiring board 40. Substantially columnar or hemispherical electrodes 41 are provided on the second surface side of the wiring board 40. Electrodes (pads) (not illustrated) electrically connected to the first semiconductor element 10, the second semiconductor element 20, and the third semiconductor element 30 are provided on the first surface of the wiring board 40. Here, an X direction (first direction) and a Y direction (second direction) are directions within the first surface of the wiring board 40 and orthogonal to each other. A Z direction (third direction) is a direction orthogonal to the X direction and the Y direction. A direction from the second surface to the first surface of the wiring board 40 is defined as an upward direction, and an opposite direction is defined as a downward direction.

The first semiconductor element 10 is provided on the first surface of the wiring board 40. The first semiconductor element 10 is a semiconductor element having a height higher than heights of the second semiconductor element 20 and the third semiconductor element 30 in the Z direction. The third semiconductor element 30, the first semiconductor element 10, and the second semiconductor element 20 are arranged side by side along the X direction. The first semiconductor element 10 is a semiconductor element having higher power consumption and higher heat generation than the second semiconductor element 20 and the third semiconductor element 30. The first semiconductor element 10 is, for example, a controller chip that controls the second semiconductor element 20 and the third semiconductor element 30. The first semiconductor element 10 is connected to the wiring board 40 by, for example, flip-chip connection. An electrode provided on a surface facing a first surface of the first semiconductor element 10 is electrically connected to the electrode provided on the first surface of the wiring board 40. The first semiconductor element 10 may be a bare chip. Alternatively, the first semiconductor element 10 may be a semiconductor package sealed with a second sealing material. The second sealing material is a mold resin, and includes an insulating resin and a filler. The first semiconductor element 10 may be an interface chip between the second semiconductor element 20 and the third semiconductor element 30, and an external device.

The second semiconductor element 20 is provided on the first surface of the wiring board 40. The second semiconductor element 20 includes, for example, one or more semiconductor memory chips that read, write, and erase data. In the second semiconductor element 20, semiconductor memory chips as bare chips are stacked along the Z direction with an adhesive layer interposed therebetween. These semiconductor memory chips are sealed with the first sealing material 50. A nonvolatile memory chip or a volatile memory chip can be used as the semiconductor memory chip. A NAND memory chip, a phase change memory chip, a resistance change memory chip, a ferroelectric memory chip, a magnetic memory chip, or the like can be used as the nonvolatile memory chip. A dynamic random access memory (DRAM) or the like can be used as the volatile memory chip. Reading, writing, and erasing of data of the semiconductor memory chip are controlled by the first semiconductor element 10.

In the semiconductor device 100, a semiconductor memory chip 21A and a semiconductor memory chip 21B are stacked. The plurality of semiconductor memory chips 21A and 21B is semiconductor chips of the same structure having the same circuit except for individual differences, and are stacked along the Z direction, for example. The plurality of semiconductor memory chips 21A and 21B may be stacked along the Z direction while being shifted in the X direction and/or the Y direction. The semiconductor memory chips 21A and 21B are electrically connected to the wiring board 40 via bonding wires 23A and 23B. In FIG. 1, the semiconductor memory chips 21A and 21B are not connected. However, as another wiring form, the semiconductor memory chips 21A and 21B may be electrically connected by a bonding wire (not illustrated), and the lowermost semiconductor memory chip 21A may be connected to the wiring board 40 by a bonding wire.

An adhesive layer 22A such as a die attach film (DAF) is provided between the semiconductor memory chip 21A and the wiring board 40, and the semiconductor memory chip 21A is fixed on the wiring board 40. An adhesive layer such as a die attach film 22B is provided between the semiconductor memory chip 21A and the semiconductor memory chip 21B, and the semiconductor memory chip 21B is fixed on the semiconductor memory chip 21A.

The third semiconductor element 30 is provided on the first surface of the wiring board 40. The third semiconductor element 30 includes, for example, one or more semiconductor memory chips that read, write, and erase data. In the third semiconductor element 30, semiconductor memory chips as bare chips are stacked along the Z direction with an adhesive layer interposed therebetween. These semiconductor memory chips are sealed with the first sealing material 50. A nonvolatile memory chip or a volatile memory chip can be used as the semiconductor memory chip. A NAND memory chip, a phase change memory chip, a resistance change memory chip, a ferroelectric memory chip, a magnetic memory chip, or the like can be used as the nonvolatile memory chip. A dynamic random access memory (DRAM) or the like can be used as the volatile memory chip. Reading, writing, and erasing of data of the semiconductor memory chip are controlled by the first semiconductor element 10.

In the semiconductor device 100, a semiconductor memory chip 31A and a semiconductor memory chip 31B are stacked. The plurality of semiconductor memory chips 31A and 31B is semiconductor chips of the same structure having the same circuit except for individual differences, and are stacked along the Z direction, for example. The plurality of semiconductor memory chips 31A and 31B may be stacked along the Z direction while being shifted in the X direction and/or the Y direction. The semiconductor memory chips 31A and 31B is electrically connected to the wiring board 40 via bonding wires 33A and 33B. In FIG. 1, the semiconductor memory chips 31A and 31B are not connected. However, as another wiring form, the semiconductor memory chips 31A and 31B may be electrically connected by a bonding wire (not illustrated), and the lowermost semiconductor memory chip 31A may be connected to the wiring board 40 by a bonding wire.

An adhesive layer 32A such as a die attach film is provided between the semiconductor memory chip 31A and the wiring board 40, and the semiconductor memory chip 31A is fixed on the wiring board 40. An adhesive layer such as a die attach film 32B is provided between the semiconductor memory chip 31A and the semiconductor memory chip 31B, and the semiconductor memory chip 31B is fixed on the semiconductor memory chip 31A.

The second semiconductor element 20 and the third semiconductor element 30 may be semiconductors arranged around the first semiconductor element 10 and having the same circuit and wiring except for individual differences. The second semiconductor element 20 and the third semiconductor element 30 may have semiconductor memory chips of the same structure having the same circuit except for individual differences. The wiring in the second semiconductor element 20 and the wiring in the third semiconductor element 30 may be substantially the same. The wiring between the second semiconductor element 20 and the wiring board 40 may be substantially identical to the wiring between the third semiconductor element 30 and the wiring board 40.

The first sealing material 50 covers the second semiconductor element 20. The first sealing material 50 is a mold resin, and includes an insulating resin and a filler. When the third semiconductor element 30 is included in the semiconductor device 100, the first sealing material 50 covers the third semiconductor element 30. An upper surface of the first sealing material 50 and an upper surface of the first semiconductor element 10 form substantially the same surface. After the first sealing material 50 is formed, the same surface is obtained by polishing and grinding the first sealing material 50.

Slits 51A and 51B are provided in the first sealing material 50 between the first semiconductor element 10 and the second semiconductor element 20 and between the first semiconductor element 10 and the third semiconductor element 30. The slits 51A and 51B extend along the Y direction. The slits 51A and 51B are provided from a surface of the first sealing material 50 on a side opposite to the wiring board 40 side toward the wiring board 40 side. The slits 51A and 51B are formed by blade dicing or laser processing. The slits are formed by processing of adopting a shape in which the slits 51A and 51B are formed in a mold used for forming the first sealing material 50.

Since element density in the semiconductor device 100 increases with improvement in performance of the semiconductor device 100, the influence of the heat generation of the semiconductor device 100 on an operation of the semiconductor device 100 is likely to become apparent. When the slits 51A and 51B are not provided, heat generated by the first semiconductor element 10 is transferred to the second semiconductor element 20 and the third semiconductor element 30 via the first sealing material 50, and temperatures of the second semiconductor element 20 and the third semiconductor element 30 increase. When the temperatures of the second semiconductor element 20 and the third semiconductor element 30 increase, decreases in operation speeds or failure of the second semiconductor element 20 and the third semiconductor element 30 may be caused. However, the heat generated by the first semiconductor element 10 is hindered from being transferred to the periphery via the first sealing material 50 by the slits 51A and 51B. The heat transferred to the second semiconductor element 20 and the third semiconductor element 30 is reduced, and the increases in the temperatures of the second semiconductor element 20 and the third semiconductor element 30 can be alleviated.

The cross-sectional conceptual diagram of FIG. 2 illustrates a length L1 of the first semiconductor element 10, a length L2 of the second semiconductor element 20 (a length of the third semiconductor element 30), a length L3 of the slits 51A and 51B, and a length L4 of the semiconductor device 100 (a length of the first sealing material 50) in the Y direction. From the viewpoint of reducing thermal conduction between the first semiconductor element 10 and the second semiconductor element 20 (third semiconductor element 30) by the slits 51A and 51B, it is preferable that L1<L3 and L2<L3 are satisfied, and it is more preferable that 1.1×L1<L3 and 1.1×L2<L3 are satisfied. When the length L3 of the slits 51A and 51B is shorter than the length L1 of the first semiconductor element 10 and the length L2 of the second semiconductor element 20 (third semiconductor element 30), an effect of reducing the thermal conduction by the slits 51A and 51B is reduced. As the length L3 of the slits 51A and 51B increases, the mechanical strength of the semiconductor device 100 is likely to decrease, but the length L3 of the slits 51A and 51B may be equal to or less than the length L4 of the semiconductor device 100. It is preferable that the length L1 of the first semiconductor element 10 and the length L2 of the second semiconductor element 20 (the length of the third semiconductor element 30) in the Y direction satisfy L1<L2. From the viewpoint of more effectively reducing the thermal conduction by the slits 51A and 51B, it is more preferable that L1<L2 is satisfied in addition to L1<L3 and L2<L3.

Here, the slit will be further described with reference to FIGS. 3 to 11.

Figure 3:
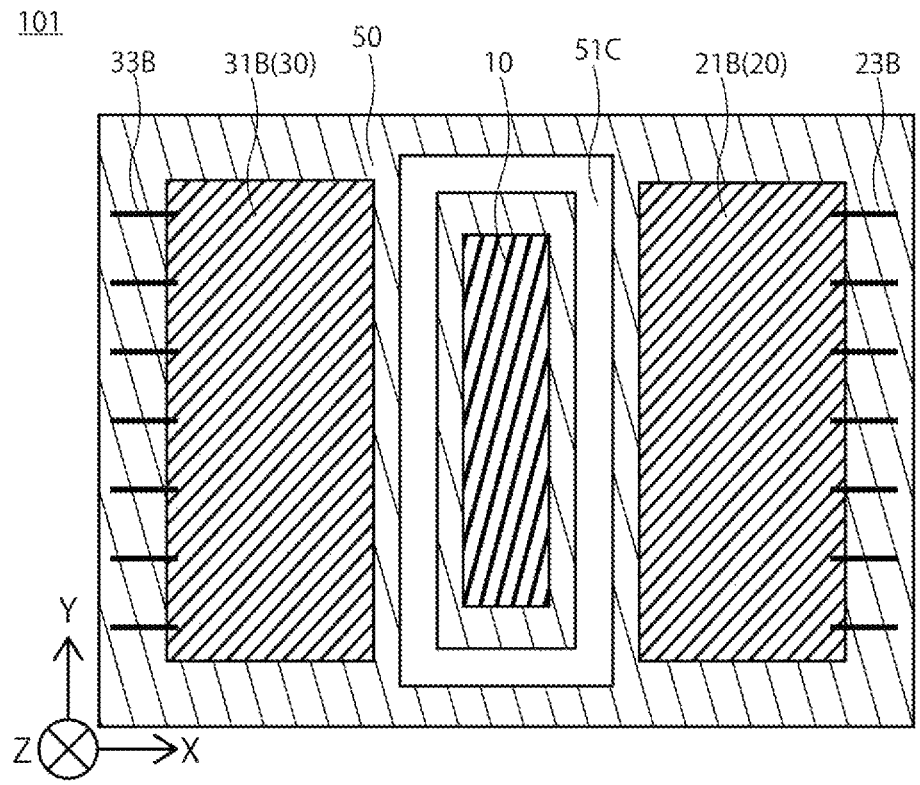
FIG. 3 is a schematic cross-sectional conceptual diagram of the semiconductor device according to the first embodiment.

FIG. 3 is a cross-sectional conceptual diagram of a semiconductor device 101. A slit 51C surrounding the first semiconductor element 10 is provided in the semiconductor device 101. The second semiconductor element 20 and the third semiconductor element 30 are arranged outside the slit 51C. The third semiconductor element 30, the first semiconductor element 10, and the second semiconductor element 20 are arranged along the X direction. In the semiconductor device 101, since the first semiconductor element 10 is surrounded by the slit 51C, the heat generated by the first semiconductor element 10 is less likely to be transferred to the second semiconductor element 20 and the third semiconductor element 30 from the Y direction.

Figure 4:
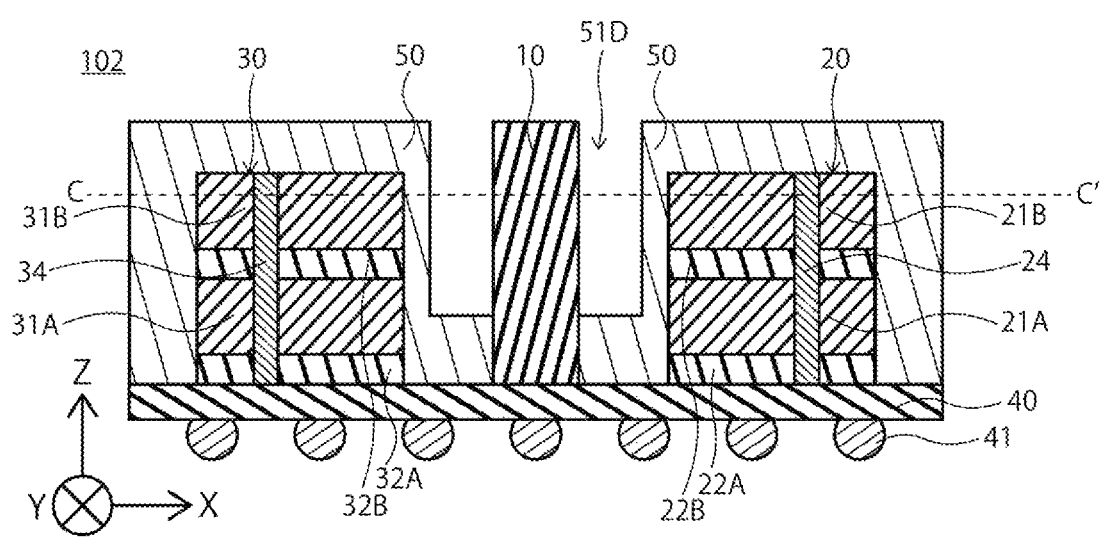
FIG. 4 is a schematic cross-sectional conceptual diagram of the semiconductor device according to the first embodiment.
Figure 5:
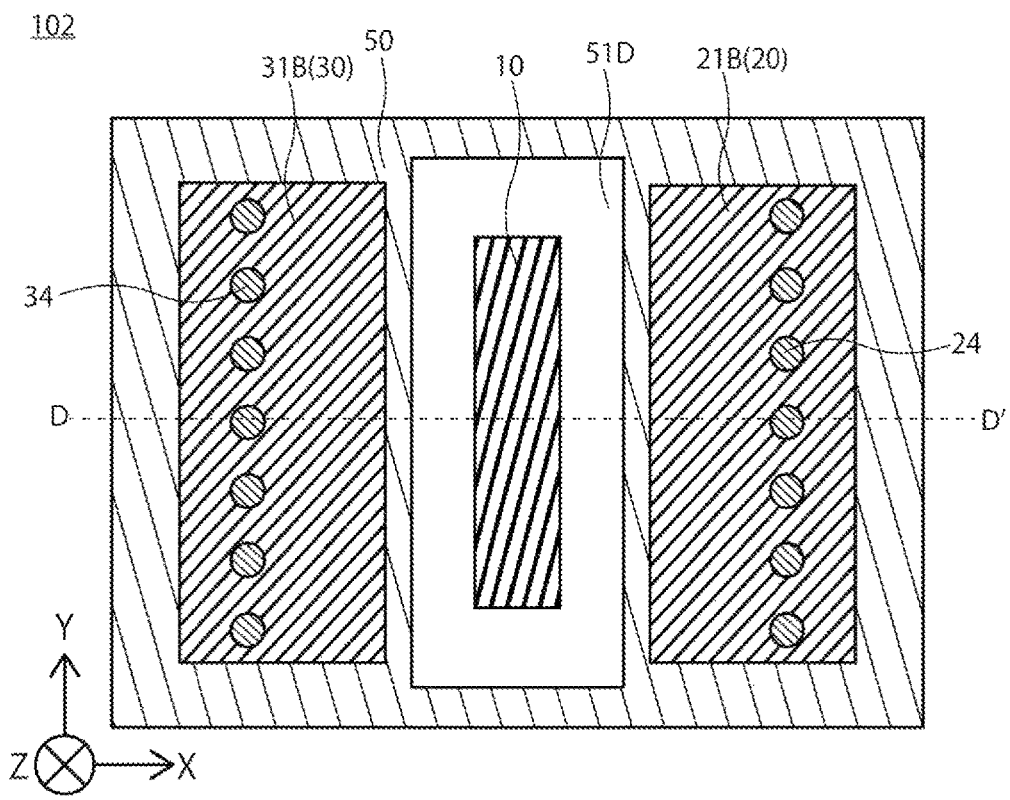
FIG. 5 is a schematic cross-sectional conceptual diagram of the semiconductor device according to the first embodiment.

FIGS. 4 and 5 are cross-sectional conceptual diagrams of a semiconductor device 102. FIG. 4 is a schematic cross-sectional conceptual diagram of the semiconductor device 102 taken along a line D-D' in FIG. 5. FIG. 5 is a schematic cross-sectional conceptual diagram of the semiconductor device 102 taken along a line C-C' in FIG. 4. In the semiconductor device 102, since the semiconductor memory chips 21A and 21B are connected by a through silicon via (TSV) 24 penetrating the semiconductor memory chips 21A and 21B, a bonding wire 23 is omitted. The semiconductor memory chips 31A and 31B are also connected by a through silicon via 34. The through silicon vias 24 and 34 are electrically connected to the wiring board 40. The first sealing material 50 is not present inside a slit 51D surrounding the first semiconductor element 10. Thus, widths of the slit 51D along the X direction and the Y direction can be larger than widths of the slit 51C. Thus, the heat generated by the first semiconductor element 10 is less likely to be transferred to the second semiconductor element 20 and the third semiconductor element 30 than in the case of using the slit 51C.

Figure 6:
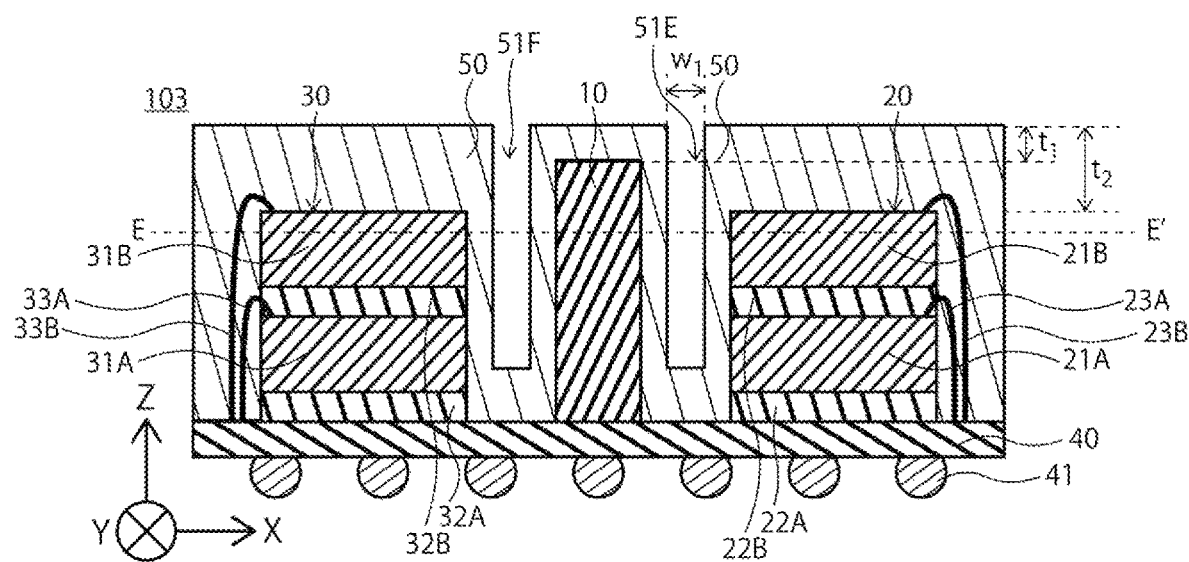
FIG. 6 is a schematic cross-sectional conceptual diagram of the semiconductor device according to the first embodiment.
Figure 7:
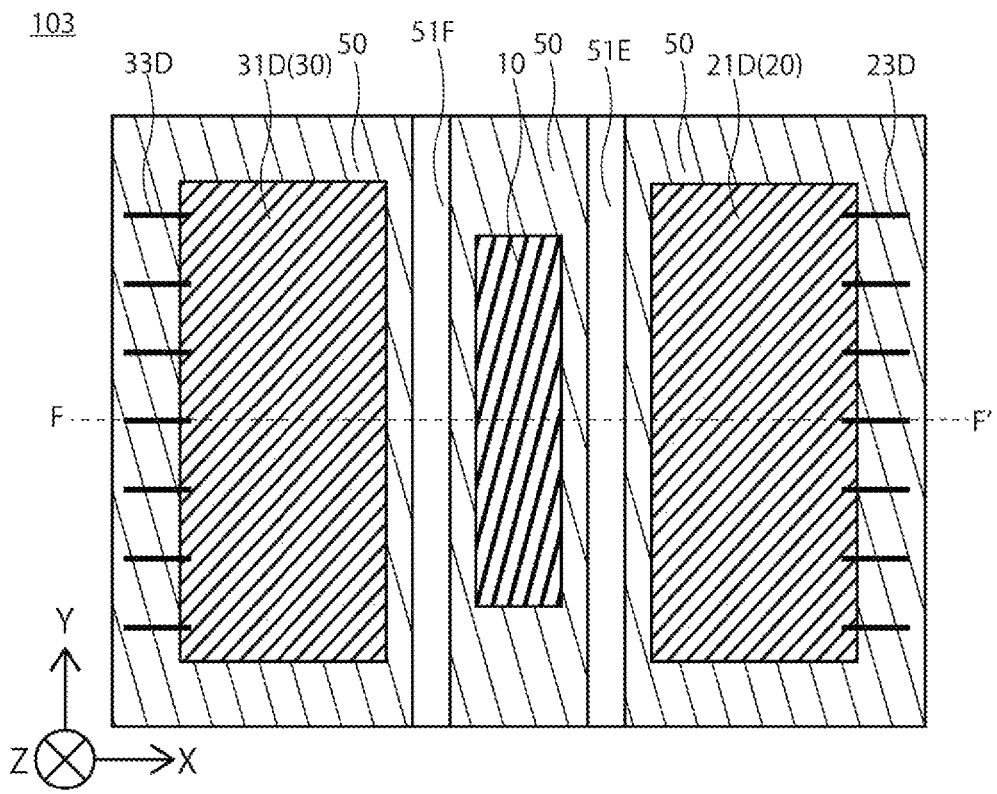
FIG. 7 is a schematic cross-sectional conceptual diagram of the semiconductor device according to the first embodiment.

FIGS. 6 and 7 are cross-sectional conceptual diagrams of a semiconductor device 103. FIG. 6 is a schematic cross-sectional conceptual diagram of the semiconductor device 103 taken along a line F-F' in FIG. 7. FIG. 7 is a schematic cross-sectional conceptual diagram of the semiconductor device 103 taken along a line E-E' in FIG. 6. A length L3 of slits 51E and 51F of the semiconductor device 103 in the Y direction is the same as a length L4 of the semiconductor device 103 in the Y direction. A side surface of the semiconductor device 103 in the Y direction is opened in a shape of the slits 51E and 51F. In the semiconductor device 103, the first sealing material 50 is provided on the upper surface of the first semiconductor element 10.

FIG. 6 illustrates a thickness t1 of the first sealing material 50 on the first semiconductor element 10 and a thickness t2 of the first sealing material 50 on the second semiconductor element 20 (a thickness of the first sealing material 50 on the third semiconductor element 30). Since a height of the first semiconductor element 10 is higher than a height of the second semiconductor element 20 and the second semiconductor element 20 is sealed with the first sealing material 50, it is preferable that t1<t2 is satisfied. There is also a mode in which the first sealing material 50 is not provided on the first semiconductor element 10. Thus, t1 is 0 or more. Accordingly, it is preferable that t1 and t2 satisfy a relationship of 0≤t1<t2. From the viewpoint of protecting the second semiconductor element 20 while suppressing the height of the semiconductor device 103, it is preferable that t1 and t2 satisfy t1<0.5×t2. The thickness of the first sealing material 50 on the first semiconductor element 10 can be changed by changing a shape of a mold used for forming the first sealing material 50 or adjusting a thickness to be removed by polishing the upper surface side of the first sealing material 50.

Since the first sealing material 50 is provided on a side surface of the second semiconductor element 20, a width w1 of the slit 51E is narrower than a distance between the first semiconductor element 10 and the second semiconductor element 20. When the width w1 of the slit 51E is wide, the effect of reducing thermal conduction is enhanced, but the mechanical strength of the semiconductor device 103 is reduced. When the width w1 of the slit 51E is narrow, it is difficult to process the slit 51E, and the effect of reducing the thermal conduction by the slit 51E is reduced. The width w1 of the slit 51E is appropriately selected depending on the design. The same applies to the slit 51F.

Figure 8:
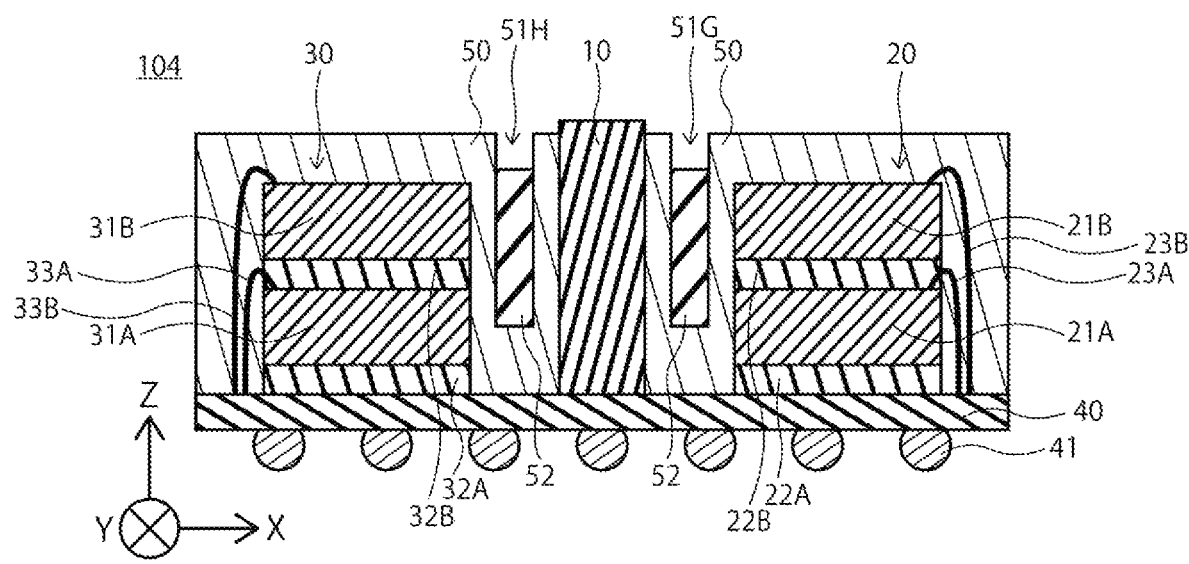
FIG. 8 is a schematic cross-sectional conceptual diagram of the semiconductor device according to the first embodiment.

FIG. 8 is a cross-sectional conceptual diagram of a semiconductor device 104. In the semiconductor device 104, members 52 having lower thermal conductivity than thermal conductivity of the first sealing material 50 are embedded in slits 51G and 51H. It is preferable that the thermal conductivity of the member 52 is lower than the thermal conductivity of the first sealing material 50. Specifically, the thermal conductivity [W/(m·K)] of the member 52 is preferably ½ to ⅕ of the thermal conductivity of the first sealing material 50. The thermal conductivity is more preferably ⅕ to ¹⁄₁₀, still more preferably ¹⁄₁₀ or less. For example, a phenol resin can be used as the member. It is preferable that the member 52 is an insulator to prevent unintended electrical conduction. The members 52 may be embedded from upper surfaces to lower surfaces of the slits 51G and 51H, or may be embedded in at least a part of the slits 51G and 51H. Since the members 52 are embedded in the slits 51G and 51H, the mechanical strength of the semiconductor device 104 can be increased.

Figure 9:
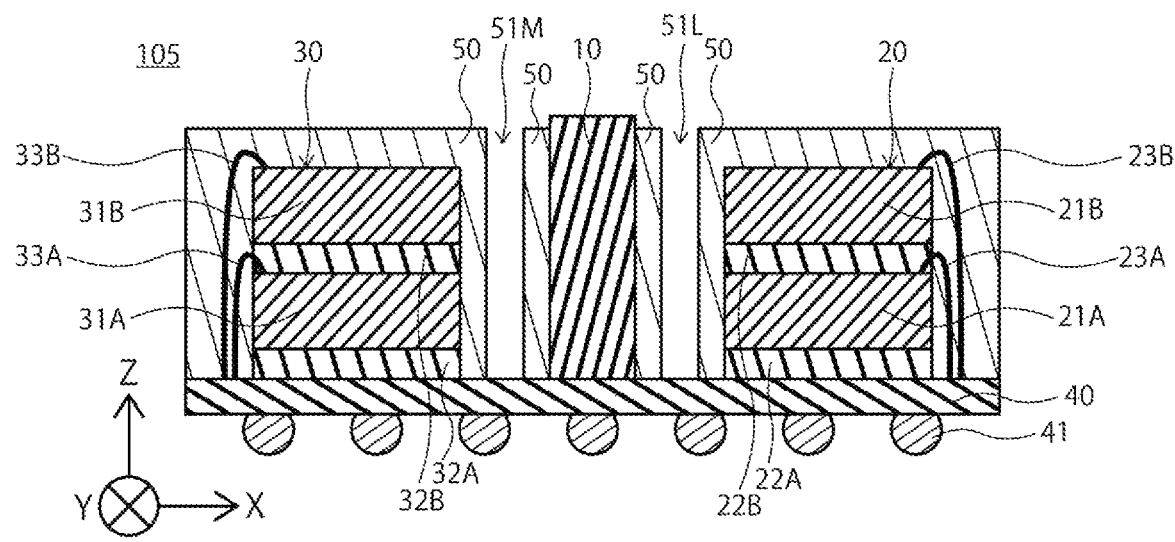
FIG. 9 is a schematic cross-sectional conceptual diagram of the semiconductor device according to the first embodiment.

FIG. 9 is a cross-sectional conceptual diagram of a semiconductor device 105. In the semiconductor device 105, bottom portions of slits 51L and 51M are positioned on the first surface of the wiring board 40. Shapes of the slits 51L and 51M in the X and Y directions are similar to the shapes of the slits 51A and 52B in FIG. 2. When a height (length in the Z direction) of the first semiconductor element 10 is H, the positions of the bottom portions of the slits 51L and 51M are preferably 0.5×H or less, and more preferably 0.2×H or less from the first surface of the wiring board 40.

The upper surface of the first sealing material 50 of the semiconductor device 105 is positioned closer to the wiring board 40 than the upper surface of the first semiconductor element 10. Thus, a part of the upper side surface of the first semiconductor element 10 is exposed from the first sealing material 50. When the first sealing material 50 is molded by using a mold, a film is provided between the semiconductor device 105 and the mold. An upper portion of the first semiconductor element 10 partially penetrates the film, and the first sealing material 50 is not formed at the penetrated portion. The penetrated portion is a portion at which the first semiconductor element 10 is exposed from the first sealing material 50. When the first sealing material 50 is molded by using a film, a surface of the first sealing material 50 is likely to have an uneven shape. A material having higher thermal conductivity than the thermal conductivity of the first sealing material 50, such as a thermal interface material (TIM) that absorbs unevenness, is provided on the first sealing material 50, and a heat sink is further provided. Accordingly, the surface of the first sealing material 50 may be either uneven or flat.

Figure 10:
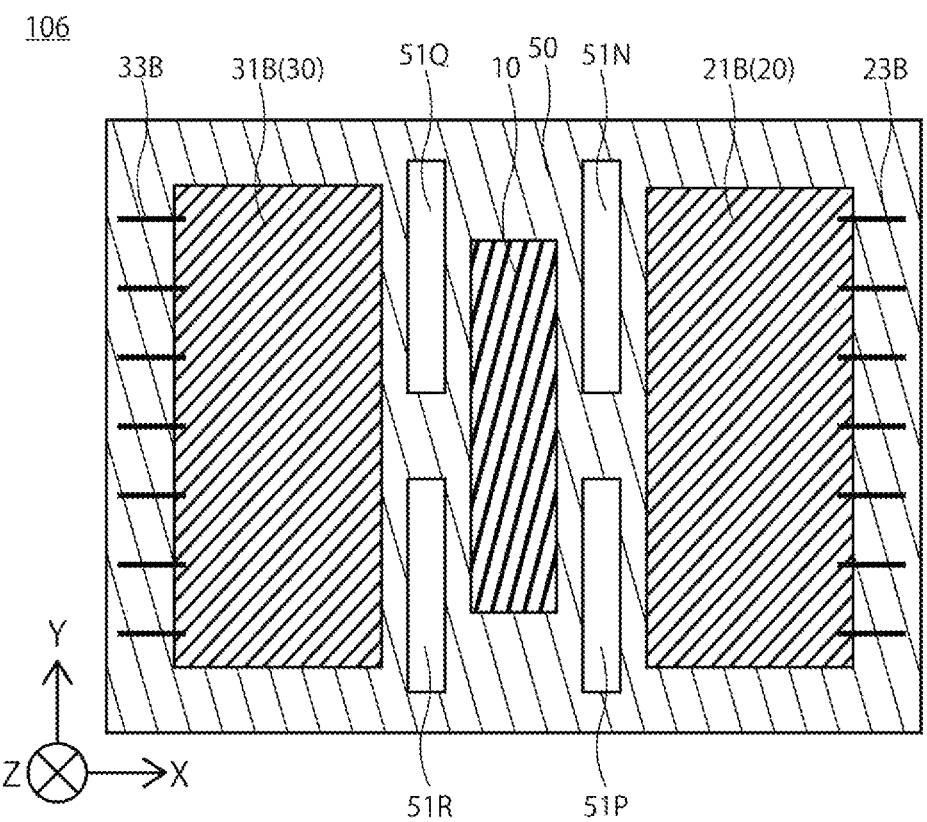
FIG. 10 is a schematic cross-sectional conceptual diagram of the semiconductor device according to the first embodiment.

FIG. 10 is a cross-sectional conceptual diagram of a semiconductor device 106. In the semiconductor device 106, the slits are separated in the Y direction. In the semiconductor device 106, the slit 51A in FIG. 2 may be separated into a slit 51N and a slit 51P. The slit 51B in FIG. 2 may be separated into a slit 51Q and a slit 51R. Heat is easily transferred from the first semiconductor element 10 to the second semiconductor element 20 and the third semiconductor element 30 by separating the slits, but since the first sealing material 50 is remained at a portion at which the slits 51 are separated, mechanical strength is improved. In the semiconductor device 106, the slits 51A and 51B in FIG. 2 may be separated into three or more slits. Alternatively, a portion of the slit 51C in FIG. 3 extending along the X direction may be separated. As described above, a form of separating the slits is not limited to the illustrated form. When the slits are separated as illustrated in the cross-sectional conceptual diagram of FIG. 10, the sum of the length of the slit 51N in the Y direction and the length of the slit 51P in the Y direction is the length L3 of the slit 51A.

Figure 11:
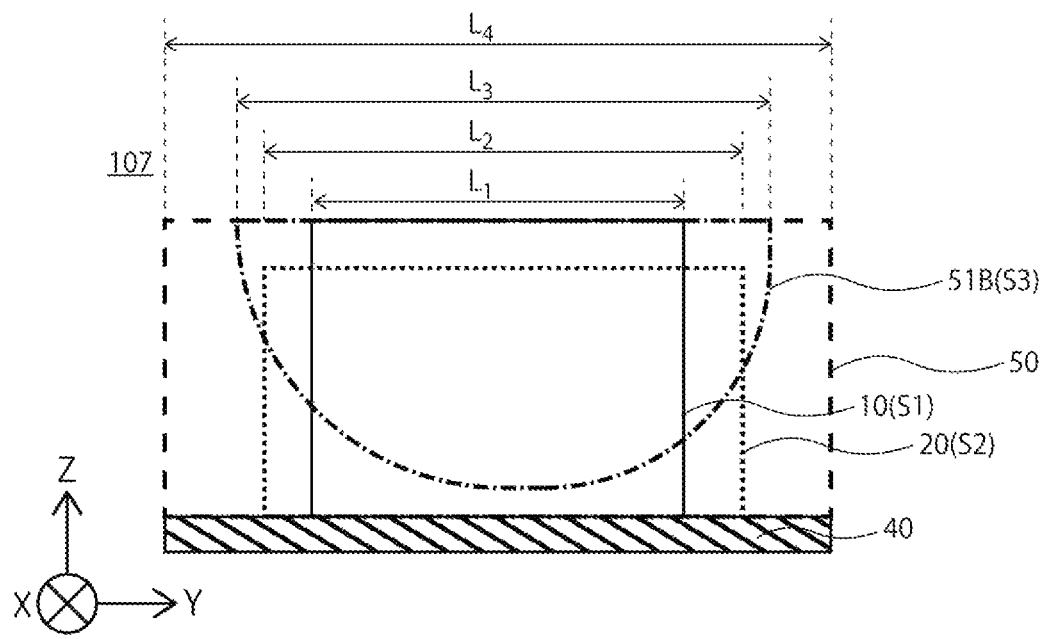
FIG. 11 is a schematic cross-sectional conceptual diagram of the semiconductor device according to the first embodiment.

FIG. 11 is a cross-sectional conceptual diagram of a semiconductor device 107. FIG. 11 is a schematic cross-sectional conceptual diagram of a semiconductor device 107 taken along a line G-G' in FIG. 2. In FIG. 11, the first semiconductor element 10 (solid line), the second semiconductor element 20 (dotted line), and the first sealing material 50 (broken line) as viewed from the plane of G-G' are also illustrated in addition to the slit 51B (long dashed dotted line). In FIG. 11, the shape of the slit 51B is semicircular. Examples of the shape of the slit 51B include a rectangular shape, a partial circular shape such as a semicircular shape, and a rectangular shape having rounded corners on the wiring board 40 side. The partial circular shape such as the semicircular shape or the rectangle having the rounded corners on the wiring board 40 side is formed in accordance with a shape of a blade.

FIG. 11 illustrates an area S1 of the first semiconductor element 10, an area S2 of the second semiconductor element 20, and an area S3 of the slit 51B. The area S1 of the first semiconductor element 10 is an area of a surface of the first semiconductor element 10 facing the second semiconductor element 20 side. The area S2 of the second semiconductor element 20 is an area of a surface of the second semiconductor element 20 facing the first semiconductor element 10 side. The area S3 of the slit 51B is an area of a surface facing the first semiconductor element 10 side. Even when the slit 51B surrounds the first semiconductor element 10, the area S3 of the slit 51B is an area of a surface facing the first semiconductor element 10 side (when the first semiconductor element 10 is a rectangular cuboid, the sum of areas of four surfaces in which the slit 51B faces the first semiconductor element 10). From the viewpoint of suppressing thermal conduction by the slit 51B, S1, S2, and S3 preferably satisfy 0.5×S1<S3 and 0.5×S2<S3, more preferably satisfy 0.8×S1<S3 and 0.8×S2<S3, and still more preferably satisfy S1<S3 and S2<S3. The same applies to the slit 51A.

For example, in the semiconductor device 100, the slit 51A may be used as it is, and the slit 51F may be used instead of the slit 51B. As described above, in the semiconductor devices 100 to 107, the slits may be combined in any manner.

Figure 12:
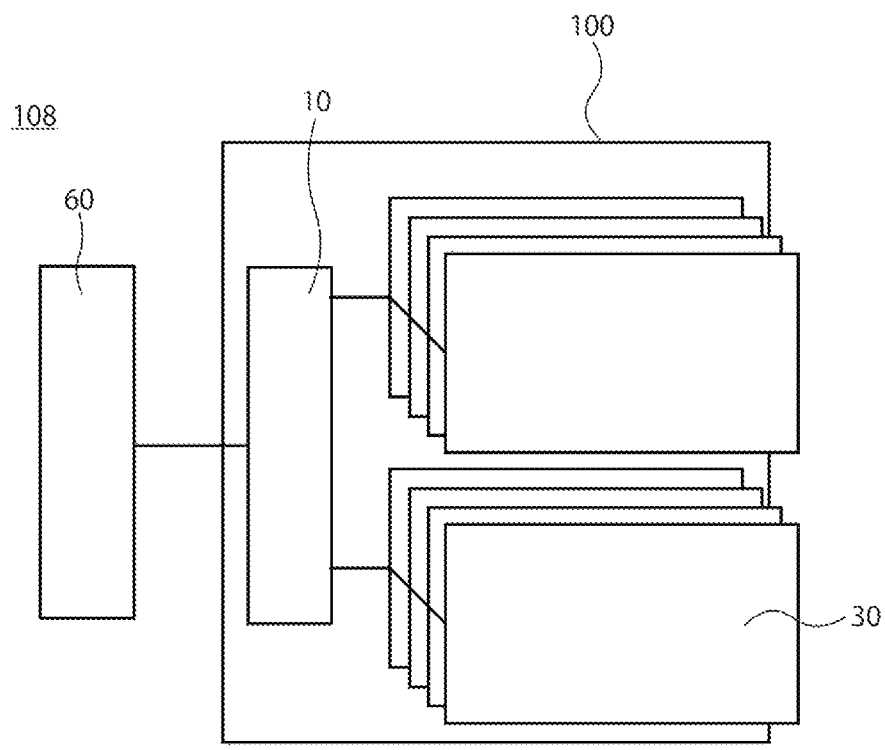
FIG. 12 is a block diagram of a memory system according to the first embodiment.

FIG. 12 illustrates a block diagram of a memory system 108. The memory system 108 in FIG. 12 includes the semiconductor device 100 and a host 60. The host 60 includes a CPU, a host interface, and the like. The host 60 and the first semiconductor element 10 are connected, and the first semiconductor element 10 reads, writes, and erases the semiconductor memory chip 21 or 31 of the second semiconductor element 20 or the third semiconductor element 30 in accordance with an instruction from the host 60. Even though the temperature of the first semiconductor element 10 increases by operating the semiconductor device 100 at a high speed or the like, since the semiconductor device 100 of the embodiment has the slits 51A and 51B, the increases in the temperatures of the second semiconductor element 20 and the third semiconductor element 30 can be suppressed, and it is possible to stably operate the semiconductor device at a high speed. The same effect can be obtained by using the semiconductor devices 101 to 107 instead of the semiconductor device 100.

Second Embodiment

Figure 13:
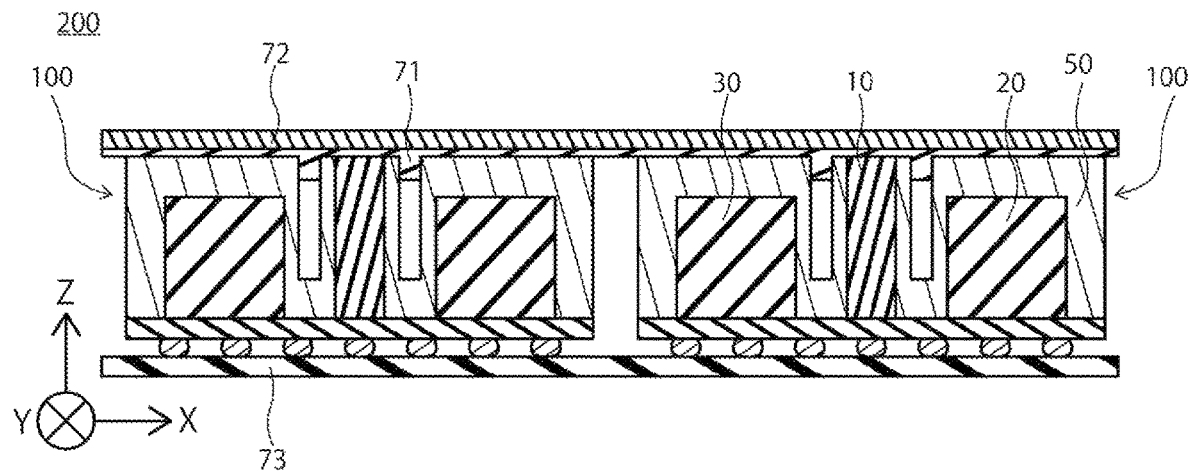
FIG. 13 is a schematic cross-sectional conceptual diagram of an apparatus according to a second embodiment.

FIG. 13 is a cross-sectional conceptual diagram of an apparatus 200. It is preferable that the semiconductor device 100 is a semiconductor storage device having a semiconductor memory chip. The apparatus 200 includes a plurality of semiconductor devices 100, a thermal interface material 71, a heat transfer plate 72, and a mounting board 73. The number of semiconductor devices 100 used in the apparatus 200 may be one or plural.

The semiconductor device 100 is mounted on the mounting board 73. When the apparatus 200 is a solid state drive (SSD), for example, an active element and a passive element (not illustrated) such as a host interface, an SSD controller, and a DRAM cache may also be mounted on the mounting board 73. The mounting board 73 is, for example, a multi-layer board.

The thermal interface material 71 may be one or more selected from the group consisting of an adhesive containing an organic resin and having high thermal conductivity, grease, thermal silicone pad, liquid metal, and the like. The thermal interface material 71 slightly enters the slits 51A and 51B.

The heat transfer plate 72 is a member having high thermal conductivity, such as a metal of a housing of the apparatus 200, a heat spreader, a case, or a heat sink. The heat transfer plate is thermally connected to the semiconductor device 100 via the thermal interface material 71, and can efficiently dissipate heat generated by the semiconductor device 100 to the outside. Since the slits 51A and 51B that prevent the heat generated by the first semiconductor element 10 from being transferred to the second semiconductor element 20 and the third semiconductor element 30 are provided in the semiconductor device 100, it is possible to suppress the increases in the temperatures of the second semiconductor element 20 and the third semiconductor element 30 during the operation of the apparatus 200, and it is possible to stably operate the semiconductor device at a high speed. The same effect can be obtained by using the semiconductor devices 101 to 107 instead of the semiconductor device 100. When silicon is present on the upper surface of the first semiconductor element 10, since the silicon and the thermal interface material 71 are in direct contact with each other, the heat can be efficiently dissipated.

Third Embodiment

Figure 14:
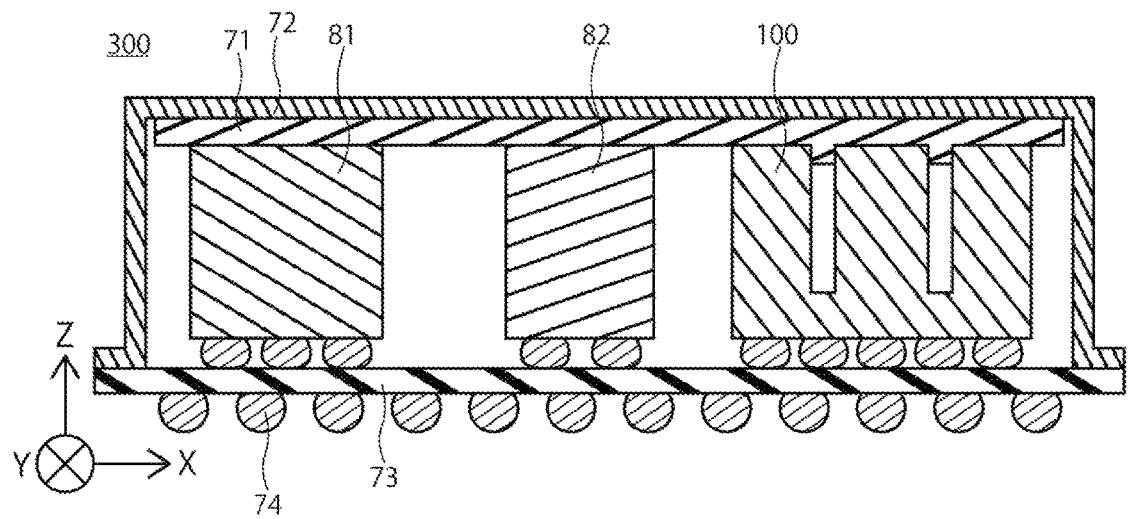
FIG. 14 is a schematic cross-sectional conceptual diagram of a semiconductor package according to a third embodiment.

FIG. 14 is a cross-sectional conceptual diagram of a semiconductor package 300. The semiconductor package 300 in FIG. 14 includes the semiconductor device 100, the thermal interface material 71, the heat transfer plate 72, the mounting board 73, electrodes 74, a calculation device 81, and a host interface 82. The semiconductor package 300 is a system on a chip (SoC).

The semiconductor device 100, the calculation device 81, and the host interface 82 are mounted on the mounting board 73. The semiconductor package 300 may include a passive element and an active element other than the illustrated components.

Examples of the calculation device 81 include a CPU, a GPU, and an FPGA. In the semiconductor package 300, information stored in the semiconductor device 100 which is the semiconductor storage device can be processed by the calculation device 81.

In the semiconductor package 300, for example, the increases in the temperatures of the second semiconductor element 20 and the third semiconductor element 30 can be suppressed to such an extent that thermal throttling functions, and it is possible to stably operate the semiconductor device 100 at a high speed. The same effect can be obtained by using the semiconductor devices 101 to 107 instead of the semiconductor device 100.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a wiring board having a first surface and a second surface on a side opposite to the first surface;
a first semiconductor element on the first surface of the wiring board;
a second semiconductor element on the first surface of the wiring board; and
a first sealing material that seals at least the second semiconductor element,
wherein a slit is formed in the first sealing material between the first semiconductor element and the second semiconductor element, and
when a thickness of the first sealing material on the first semiconductor element is t1 and a thickness of the first sealing material on the second semiconductor element is t2, the t1 and the t2 satisfy a relationship of $0 \leq t1 < t2$.

2. The device according to claim 1,
wherein, when an in-plane direction of the wiring board is a first direction, an in-plane direction of the wiring board orthogonal to the first direction is a second direction, the slit extends in the second direction, a length of the first semiconductor element in the second direction is L1, and a length of the second semiconductor element in the second direction is L2, L1<L2 is satisfied.

3. The device according to claim 2, wherein, when a length of the slit in the second direction is L3, L1<L3 and L2<L3 are satisfied.

4. The device according to claim 2, wherein, when the length of the slit in the second direction is L3, 1.1×L1<L3 and 1.1×L2<L3 are satisfied.

5. The device according to claim 1, wherein the first sealing material is not present inside the slit.

6. The device according to claim 1, wherein the first sealing material is provided on a side surface of the second semiconductor element.

7. The device according to claim 1, wherein, when an in-plane direction of the wiring board is a first direction, an in-plane direction of the wiring board orthogonal to the first direction is a second direction, a direction orthogonal to the first direction and the second direction is a third direction, and a length of the first semiconductor element in the third direction is H, a position of a bottom portion of the slit is 0.5×H or less from the first surface of the wiring board.

8. The device according to claim 1, wherein the t1 and the t2 satisfy t1<0.5×t2.

9. The device according to claim 1, wherein, when an area of a surface of the first semiconductor element facing the second semiconductor element side is S1, an area of a surface of the second semiconductor element facing the first semiconductor element side is S2, and an area of a surface of the slit facing the first semiconductor element side is S3, the S1, the S2, and the S3 satisfy S1<S3 and S2<S3.

10. The device according to claim 1, wherein a part of a side surface of the first semiconductor element is exposed from the first sealing material.

11. The device according to claim 1, wherein the slit surrounds the first semiconductor element.

12. The device according to claim 1, wherein a width of the slit is narrower than a distance between the first semiconductor element and the second semiconductor element.

13. The device according to claim 1, wherein a member having lower thermal conductivity than thermal conductivity of the first sealing material is embedded in the slit.

14. The device according to claim 7, wherein a position of a bottom portion of the slit is 0.2×H or less from the first surface of the wiring board.

15. The device according to claim 1, wherein the first semiconductor element is a controller chip sealed with a second sealing material, the second semiconductor element includes a semiconductor memory chip, and the semiconductor memory chip is sealed with the first sealing material.

* * * * *